(12) United States Patent
Sakurai et al.

(10) Patent No.: US 7,569,164 B2
(45) Date of Patent: Aug. 4, 2009

(54) SOLDER PRECOATING METHOD

(75) Inventors: Hitoshi Sakurai, Kakogawa (JP); Yoichi Kukimoto, Kakogawa (JP)

(73) Assignee: Harima Chemicals, Inc., Hyogo (JP)

( * ) Notice: Subject to any disclaimer, the term of this patent is extended or adjusted under 35 U.S.C. 154(b) by 0 days.

(21) Appl. No.: 11/699,046

(22) Filed: Jan. 29, 2007

(65) Prior Publication Data
US 2008/0179383 A1  Jul. 31, 2008

(51) Int. Cl.
*H01B 1/02* (2006.01)
*H01B 1/22* (2006.01)

(52) U.S. Cl. .................. 252/514; 252/71; 252/500; 75/255; 148/22; 148/23; 148/24; 148/25; 228/56.3; 228/180.22; 428/42.1; 438/200

(58) Field of Classification Search ............... 252/500, 252/71, 514; 75/252, 255, 345; 148/24, 148/25, 22, 23; 228/56.3, 245, 180.22; 438/615, 438/200; 501/53; 428/42.1
See application file for complete search history.

(56) References Cited

U.S. PATENT DOCUMENTS

| | | | |
|---|---|---|---|
| 5,162,257 A | | 11/1992 | Yung |
| 5,294,242 A | * | 3/1994 | Zurecki et al. ............ 75/345 |
| 5,296,649 A | * | 3/1994 | Kosuga et al. ............ 174/250 |
| 5,385,290 A | * | 1/1995 | Degani .................. 228/180.22 |
| 5,431,745 A | * | 7/1995 | Koschlig et al. ........... 148/24 |
| 6,193,143 B1 | * | 2/2001 | Ishikawa ................. 228/245 |
| 6,519,842 B2 | * | 2/2003 | Fukunaga et al. ......... 29/840 |
| 6,881,278 B2 | * | 4/2005 | Amita et al. ............. 148/23 |
| 6,884,278 B2 | * | 4/2005 | Shimizu et al. ........... 75/255 |
| 6,923,875 B2 | * | 8/2005 | Ikeda et al. .............. 148/24 |
| 2002/0046627 A1 | * | 4/2002 | Amita et al. ............. 75/252 |
| 2002/0064933 A1 | * | 5/2002 | Ueoka .................... 438/615 |
| 2003/0085253 A1 | * | 5/2003 | Shimizu et al. .......... 228/56.3 |
| 2003/0157761 A1 | * | 8/2003 | Sakuyama ............... 438/200 |
| 2003/0200836 A1 | * | 10/2003 | Amita et al. ............. 75/255 |
| 2004/0217152 A1 | | 11/2004 | Taguchi |

(Continued)

FOREIGN PATENT DOCUMENTS

EP    1 038 628 A1    9/2000

(Continued)

OTHER PUBLICATIONS

U.S. Appl. No. 09/646,308, filed Sep. 14, 2001.

*Primary Examiner*—Mark Kopec
*Assistant Examiner*—Khanh Tuan Nguyen
(74) *Attorney, Agent, or Firm*—Sughrue Mion, PLLC

(57) ABSTRACT

A solder paste composition used in a solder precoating method of forming solder bumps by forming a dam around electrodes on a substrate, filling a solder paste composition on the electrodes within opening parts surrounded by the dam, and heating the solder paste composition filled, so that solder is adhered to the surfaces of the electrodes. The solder paste composition contains solder powder, which is of a particle size distribution in which particles having a particle size of below 10 μm are present 16% or more, and a sum of the particles having a particle size of below 10 μm and particles having a particle size of 10 μm or more and below 20 μm is 90% or more. This enables to suppress occurrence of bump defects, and form solder bumps of a uniform height with a high yield by a solder precoating method using the dam.

9 Claims, 1 Drawing Sheet

U.S. PATENT DOCUMENTS

| | | | | |
|---|---|---|---|---|
| 2005/0217757 A1* | 10/2005 | Miyano | | 148/24 |
| 2006/0071051 A1* | 4/2006 | Shoji et al. | | 228/56.3 |
| 2007/0044295 A1* | 3/2007 | Chen | | 29/592.1 |
| 2007/0131912 A1* | 6/2007 | Simone et al. | | 252/500 |
| 2007/0167307 A1* | 7/2007 | Brodie | | 501/53 |
| 2007/0181218 A1* | 8/2007 | Sakamoto et al. | | 148/25 |
| 2007/0218238 A1* | 9/2007 | Greer | | 428/42.1 |
| 2008/0023665 A1* | 1/2008 | Weiser et al. | | 252/71 |

FOREIGN PATENT DOCUMENTS

| | | | |
|---|---|---|---|
| EP | 1 342 726 A1 | | 9/2003 |
| JP | 62-014433 | * | 1/1987 |
| JP | 01-157796 | * | 6/1989 |
| JP | 02-310991 | | 12/1990 |
| JP | 6-125169 A | | 5/1994 |
| JP | 6-142975 A | | 5/1994 |
| JP | 07-155985 | * | 6/1995 |
| JP | 07 326853 A | | 12/1995 |
| JP | 2002-141367 A | | 5/2002 |
| JP | 2002-192380 A | | 7/2002 |
| JP | 2002-334895 A | | 11/2002 |
| JP | 2002-361475 A | | 12/2002 |
| JP | 2003-251494 | | 9/2003 |
| JP | 2005-298921 | * | 10/2005 |
| WO | WO 99/64199 A1 | | 12/1999 |
| WO | WO 01/72466 A | | 10/2001 |

* cited by examiner

SOLDER PRECOATING METHOD

BACKGROUND OF THE INVENTION

1. Field of the Invention

The present invention relates to a solder paste composition suitable, when mounting electronic components on an electronic circuit substrate, for precoating the substrate with solder by using a dam. The present invention also relates to a solder precoating method using the solder paste composition.

2. Description of Related Art

Recently, as the miniaturization and the lightening of electronic equipments are enhanced, electronic components to be mounted requires a large number of pins and a fine pitch, and a conductor pattern also increases the tendency of a fine pitch where a large number of conductors are formed at extremely small spaced intervals in a narrow range. Therefore, when the electronic components are connected to an electronic circuit substrate, there is widely employed amounting method using solder bumps instead of a conventional wire bonding.

As a method of forming the solder bumps, a solder precoating method using a resin mask (a dam) is employed (Japanese Unexamined Patent Publication No. 2002-334895). FIGS. 1(a) to 1(c) are process drawings showing the solder bumps forming method by means of the solder precoating method using a general dam, as described in Japanese Unexamined Patent Publication No. 2002-334895.

In this bump forming method, on a substrate 1 coated with a solder resist film 3 provided with opening parts for preventing electrodes 2 formed on the surface of the substrate 1 from being covered, a dam 4 is firstly formed so as to surround the electrodes 2, as shown in FIG. 1(a).

Subsequently, as shown in FIG. 1(b), a solder paste composition 5 containing predetermined solder powder is filled over the electrodes 2 within the opening parts surrounded by the dam 4. This is then heated to have the solder adhere to the surfaces of the electrodes 2, thereby forming solder bumps 6, as shown in FIG. 1(c).

In accordance with the solder precoating method using the above-mentioned dam 4, the solder bumps 6 can be formed with a fine pitch.

However, during the time of heat-melting, the solder powder within the solder paste composition 5 filled within the opening parts surrounded by the dam 4 cannot be deposited satisfactorily on the electrodes 2. This results in the problem that no solder bumps 6 can be formed on the electrodes 2, being called "bump defect." Only a bump defect on a substrate would ruin the substrate. Hence, there has been a strong desire for the development of a solder paste composition capable of forming the bumps 6 with a high yield.

There has also been a tendency of non-uniformity in the height of the solder bumps 6 formed. It is preferable to form the solder bumps 6 so as to have a uniform height because the uniformity in the height of the solder bumps 6 exerts a great influence on the reliability of junction when mounting the components in the succeeding step.

Compared with the conventional manner using no dam, with the solder precoating method using the dam, the opening parts above the electrodes become thick by the amount of the dam thickness (In general, the thickness of the dam 4 is several times to several tens times the thickness of the solder resist film 3). Consequently, with the method using the dam, the solder powder cannot be deposited satisfactorily on the electrodes 2. This creates the above-mentioned problems not encountered in the conventional manner.

Japanese Unexamined Patent Publication No. 2002-141367 describes a way of forming bumps in a solder precoating method using a mask (a dam), wherein a solder paste contains solder powder, and 10 weight % or below of the solder powder have a particle size of not less than the thickness of the mask (the dam) nor more than 1.5 times the thickness thereof.

This publication No. 2002-141367 describes that, even if a squeegee is repeatedly shifted on the mask in order to ensure the filling of the solder paste into opening parts, the solder powder already filled in the opening parts is less likely to be removed, and the bumps are unsusceptible to variations in dimension. However, this method is not necessarily sufficient to suppress the variations in the bumps. This publication is also silent about the bump defect due to unsatisfactory deposition of the solder powder on the electrodes during the time of heat-melting.

SUMMARY OF THE INVENTION

An advantage of the present invention is to provide a solder paste composition with which the occurrence of bump defects can be suppressed, and solder bumps of a uniform height can be formed with a high yield by a solder precoating method using a dam, as well as a solder precoating method using the solder paste composition.

The present inventors have made tremendous research effort to solve the above-mentioned problems, and they have completed the present invention based on the following new finding. That is, in a solder paste composition used in a solder precoating method using a dam, when the solder powder contained in the solder paste composition has a predetermined particle size distribution, the solder powder in the solder paste composition filled in opening parts surrounded by the dam can surely be deposited on electrodes during the time of heat-melting, thereby suppressing the occurrence of bump defects. This enables the yield to be improved and the formed bumps to have a uniform height.

Specifically, the solder paste composition of the present invention can be comprised of the following constitutions.

(1) A solder paste composition used in a solder precoating method of forming solder bumps by forming a dam around electrodes on a substrate, filling a solder paste composition over the electrodes within opening parts surrounded by the dam, and heating the solder paste composition filled, so that solder is adhered to surfaces of the electrodes. The solder paste composition contains solder powder, which is of a particle size distribution in which particles having a particle size of below 10 μm are present 16% or more, and a sum of the particles having a particle size of below 10 μm and particles having a particle size of 10 μm or more and below 20 μm is 90% or more.

(2) The solder paste composition as set forth in the item (1), wherein the solder powder is of a particle size distribution in which particles having a particle size of below 10 μm are present 20% or more.

(3) The solder paste composition as set forth in the item (1), wherein the solder powder is of a particle size distribution in which a sum of particles having a particle size of below 10 μm and particles having a particle size of 10 μm or more and below 20 μm is 95% or more.

(4) The solder paste composition as set fourth in any one of the items (1) to (3), the solder paste composition being of deposition type.

(5) The solder paste composition as set forth in the item (4), containing tin powder and salt of metal selected from lead, copper, and silver.

(6) The solder paste composition as set fourth in the item (4), containing tin powder, and a complex of at least one selected from silver ion and copper ion and at least one selected from aryl phosphines, alkyl phosphines, and azoles.

(7) The solder paste composition as set forth in the item (5) or (6), wherein a ratio of a mass of the tin powder to a mass of the salt of metal or the complex is 99:1 to 50:50.

(8) A solder precoating method of forming solder bumps by forming a dam around electrodes on a substrate, filling a solder paste composition over the electrodes within opening parts surrounded by the dam, and heating the solder paste composition filled, so that solder is adhered to surfaces of the electrodes. The solder precoating method uses a solder paste composition containing solder powder, which is of a particle size distribution in which particles having a particle size of below 10 μm are present 16% or more, and a sum of the particles having a particle size of below 10 μm and particles having a particle size of 10 μm or more and below 20 μm is 90% or more.

(9) The solder precoating method as set fourth in the item (8), wherein the solder powder is of a particle size distribution in which particles having a particle size of below 10 μm are present 20% or more.

(10) The solder precoating method as set fourth in the item (8), wherein the solder powder is of a particle size distribution in which a sum of particles having a particle size of below 10 μm and particles having a particle size of 10 μm or more and below 20 μm is 95% or more.

(11) The solder precoating method as set fourth in any one of the items (8) to (10), wherein the solder paste composition is of deposition type.

(12) The solder precoating method as set fourth in the item (11), wherein the solder paste composition contains tin powder and salt of metal selected from lead, copper, and silver.

(13) The solder precoating method as set fourth in the item (11), wherein the solder paste composition contains tin powder, and a complex of at least one selected from silver ion and copper ion and at least one selected from aryl phosphines, alkyl phosphines, and azoles.

(14) The solder precoating method as set fourth in the item (12) or (13), wherein a ratio of a mass of the tin powder to a mass of the salt of metal or the complex is 99:1 to 50:50.

In the present invention, the term "mass" used for various ratios may be transposed to the term "weight". Even if the term "mass" is transposed to the term "weight", there is no inconvenience in the range of the ratio.

In accordance with the present invention, in the solder paste composition used in the solder precoating method using the dam, the solder powder contained in the solder paste composition has a predetermined particle size distribution. Hence, the solder powder in the solder paste composition filled in the opening parts surrounded by the dam can surely be deposited on the electrodes during the time of heat-melting, thereby suppressing the occurrence of bump defects. This produces the effect of improving the yield and providing the solder bumps of a uniform height. Additionally, by setting a particle size distribution of the solder powder contained in the solder paste composition as the further specific range, the occurrence of bump defects can be suppressed more effectively, and the solder bumps of a more uniform height can be provided. Additionally, by choosing the deposition type of solder paste composition as the above-mentioned solder paste composition, solder bumps can be formed accurately with a fine pitch on the electrodes, and the occurrence of voids can also be suppressed.

Other objects and advantages of the present invention will become more apparent from the following detailed description of the present invention when taken in conjunction with the accompanying drawings.

DESCRIPTION OF PREFERRED EMBODIMENTS

Figure 1:
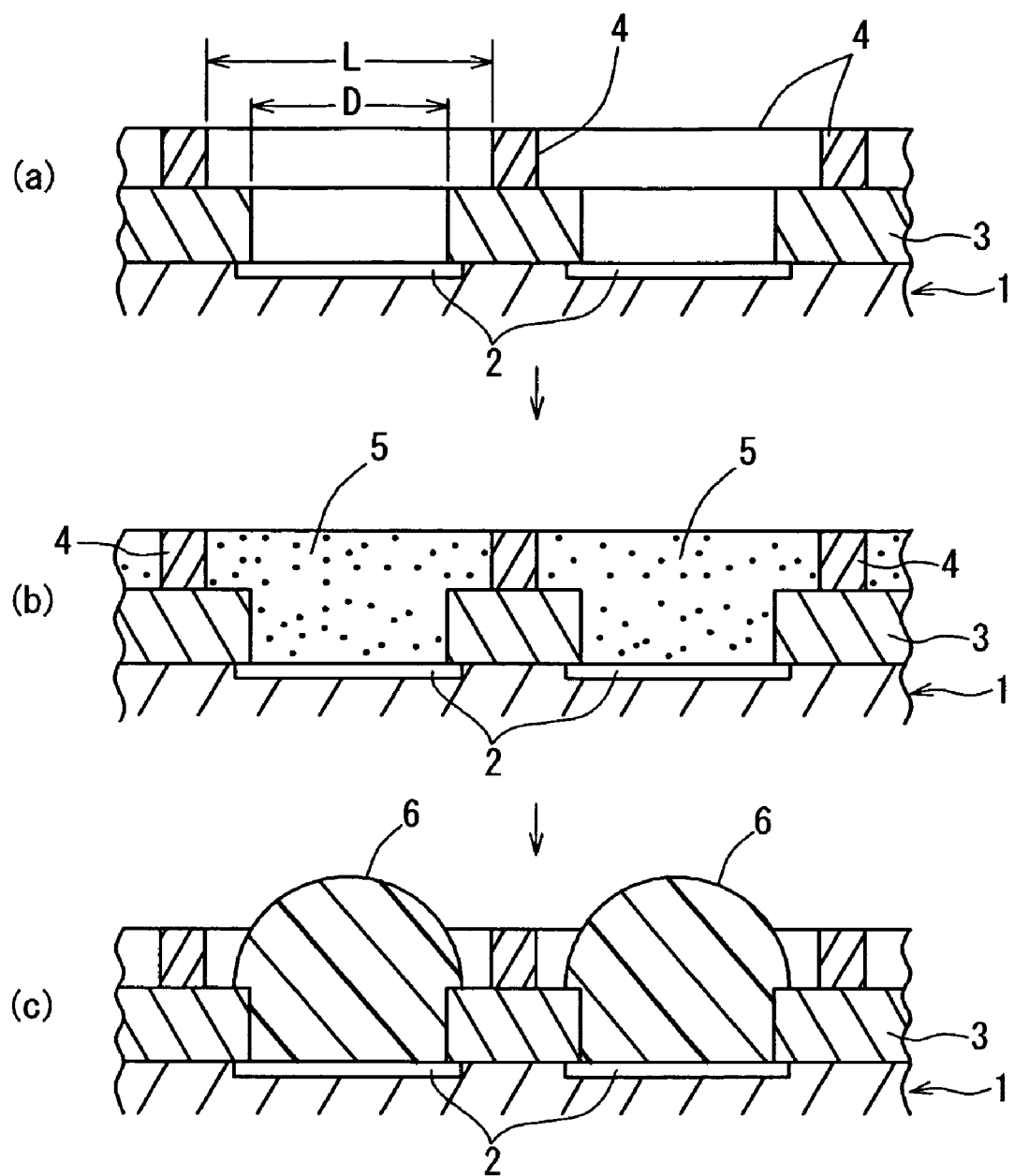
FIGS. 1(a) to 1(c) are process drawings showing a method of forming solder bumps by a solder precoating method using a dam.

A preferred embodiment of a solder paste composition and a solder precoating method using the solder paste composition according to the present invention will be described below in detail with reference to the accompanying drawings. FIG. 1 shows a method of forming solder bumps using the solder paste composition in this preferred embodiment. In this method of forming the solder bumps, on a substrate 1 coated with a solder resist film 3 provided with opening parts for preventing electrodes 2 formed on the surface of the substrate 1 from being covered, a dam 4 is firstly formed so as to surround the electrodes 2, as shown in FIG. 1(a).

Subsequently, as shown in FIG. 1(b), a solder paste composition 5 is filled over the electrodes 2 within the opening parts surrounded by the dam 4. The filled solder paste composition 5 is then heated so that the solder can be adhered to the surfaces of the electrodes 2, thereby forming solder bumps 6, as shown in FIG. 1(c) (a solder precoating method).

A plurality of the electrodes 2 is disposed with a predetermined pitch on the surface of the substrate 1. As the solder resist film 3, epoxy resin, acryl resin, polyimide resin and the like can be used, and epoxy resin is preferred.

The dam 4 can be formed with, for example, a film-shaped photoresist, a dry film resist, or a liquid photoresist. When using the film-shaped photoresist, it may be press-adhered to the surface of the substrate 1. When using the liquid photoresist, the dam 4 can be formed by applying the liquid resin to the surface of the substrate 1 by using coating means such as a spin coater, allowing the liquid resin to be cured, and performing exposure process and development (etching) process through a predetermined photomask (not shown). Examples of etchant are $Na_2CO_3$ aqueous solution, $Cu_2Cl_2$ aqueous solution, $CuCl_2$ aqueous solution, and $FeCl_3$ aqueous solution.

The dam 4 may be formed so as to surround the electrodes 2, and have such a wall-shape as to partition the electrodes 2 from each other.

The internal diameter of the dam 4 (the length of a side when it is a tetragon) L is about 1 to 3 times, preferably 1.2 to 2 times to a diameter D of the exposed electrodes 2. No special limitations are imposed on the thickness of the dam 4 (namely the thickness of the resist resin film), and it may be higher or lower than the height of the solder bumps 6 formed. Specifically, the height of the solder bumps 6 is 0.05 to 3 times, preferably 0.1 to 1.5 times to a total thickness of the thickness of the dam 4 and the thickness of the solder resist film 3. The thickness of the dam 4 is usually about 10 to 300 μm, preferably about 30 to 150 μm.

The dam 4 may be removed after forming the solder bumps 6, or may remain as it is. However, when the height of the dam 4 is close to or over the height of the solder bumps 6, it is preferable to remove the dam 4 because it might constitute an obstruction of solder joint. The dam 4 can be removed with, for example, alkaline treatment using alkali aqueous solution such as sodium hydroxide or potassium hydroxide, or organic amine aqueous solution such as 2-ethanol amine solution, or organic solvent solution.

On the other hand, from the viewpoint of simplifying the process, it is preferable that the dam 4 be not removed. In accordance with the present invention, the step of removing the dam 4 is not necessarily required because the solder height can be sufficiently high by adjusting the dam height of the resist and the amount of metal in the material.

Here, the solder paste composition 5 contains solder powder, which is of a particle size distribution in which particles having a particle size of below 10 μm are present 16% or more, preferably 20% or more, and a sum of the particles having a particle size of below 10 μm and particles having a particle size of 10 μm or more and below 20 μm is 90% or more, preferably 95% or more. Thus, the solder powder in the solder paste composition 5 filled in the opening parts surrounded by the dam 4 shown in FIG. 1(*b*) can surely be deposited on the electrodes 2 during the time of heat-melting, thereby suppressing the occurrence of bump defects. This enables the yield to be improved and the formed bumps to have a uniform height. In contrast, when the particle size distribution of the above-mentioned solder powder is not the above pre determined particle size distribution, there may arise bump defects and variations in the height of the formed solder bumps 6.

In the present invention, the term "bump defects" means there are regions on the electrodes 2 where no solder bump 6 is formed. For example, the presence or absence of a solder bump defect region and the number of occurrence of defects can be determined on a microscope ("VHX-200" manufactured by KEYENCE CORPORATION), as described later.

The particle size distribution in the present invention is a value determined by measuring it with a microtrack method. The term "microtrack method" means a method of measuring a particle size distribution, which uses the diffraction scattering with laser, and can measure it with a high resolution in a wide measuring range.

No special limitations are imposed on the composition of the solder powder. For example, there are solder alloy powders of Sn (tin)-Pb (lead) base, Sn—Ag (silver) base, or Sn—Cu (copper) base, and no-lead alloy powders of Sn—Ag—In (indium) base, Sn—Ag—Bi (bismuth) base, or Sn—Ag—Cu base. These solder powders may be used singularly or in combination of two or more kinds. For example, Sn—Ag—In base and Sn—Ag—Bi base may be blended together to obtain Sn—Ag—In—Bi base solder alloy powder, or the like.

No special limitations are imposed on the above-mentioned solder paste composition 5, except that it contains solder powder having a predetermined particle size distribution. In the present invention, a deposition type solder composition is preferred. By using the deposition type solder composition as the solder paste composition 5, the solder bumps 6 can be formed accurately on the electrodes 2 with a fine pitch, and the occurrence of voids can be suppressed.

The deposition type solder composition contains, for example, tin powder and organic acid lead salt as solder powder. When this composition is heated, the lead atomics of the organic acid lead salt can be replaced with tin atomics and liberated, and they can be diffused in excessive tin metallic powder, thereby forming a Sn—Pb alloy.

As this deposition type solder composition, there are, for example, (i) a deposition type solder composition containing tin powder and the salt of metal selected from lead, copper, silver and the like; or (ii) a deposition type solder composition containing tin powder and a complex of at least one selected from silver ion and copper ion and at least one selected from aryl phosphines, alkyl phosphines, and azoles. In the above-mentioned deposition type composition, the metal salt of the above (i) and the complex of the above (ii) can be mixed together. Especially, it is preferable for the present invention to use a lead-free deposition type solder composition.

In the present invention, the term "tin powder" indicates tin-silver base tin alloy powder containing silver, and tin-copper base tin alloy powder containing copper and the like, in addition to metal tin powder.

Examples of the metal salt of the above (i) are organic carboxylate and organic sulfonate.

As the organic carboxylate, mono- or dicarboxylic acid having a carbon number of 1 to 40 can be used. Examples of the organic carboxylic acid are lower fatty acid such as formic acid, acetic acid, or propionic acid; fatty acid obtainable from animal or vegetable oil and fat such as caproic acid, caprylic acid, lauric acid, myristic acid, palmitic acid, stearic acid, oleic acid, or linoleic acid; various kinds of synthetic acids obtainable from organic synthetic reaction such as 2,2-dimethylpentanoic acid, 2-ethylhexanoic acid, isononanoic acid, 2,2-dimethyloctanoic acid, or n-undecanoic acid; resin acid such as pimaric acid, abietic acid, dehydroabietic acid, or dihydroabietic acid; monocarboxylic acid such as naphthenic acid obtainable from petroleum; dimmer acid obtainable from synthesis of tall oil fatty acid or soybean fatty acid; and dicarboxylic acid such as polymer rosin obtainable from dimerization of rosin. Two or more kinds of these may be contained.

Examples of the organic sulfonic acid are methane sulfnic acid, 2-hydoxyethanesulfonic acid, 2-hydroxypropane-1-sulfonic acid, trichloromethanesulfonic acid, trifluoromethanesulfonic acid, benzenesulfonic acid, toluenesulfonic acid, phenolsulfonic acid, cresolsulfonic acid, anisolesulfonic acid, and naphthalenesulfonic acid. Two or more kinds of these may be contained.

The complex of the above (ii) is a complex of silver ion and/or copper ion, and at least one selected from aryl phosphines, alkyl phosphines, and azoles.

As the above-mentioned phosphines (aryl phosphines or alkyl phosphines), for example, a compound represented by the following general formula (1) is suitable.

(wherein $R_1$, $R_2$, and $R_3$ may be the same or different and each represents a substitutive or a non-substitutive aryl group, or substitutive or non-substitutive chain or cyclic alkyl group having a carbon number of 1 to 8. Here, the hydrogen atom of the aryl group may be substituted at any arbitrary position with an alkyl group or alkoxyl group having a carbon number of 1 to 8, a hydroxyl group, an amino group, or a halogen atom. The hydrogen atom of the alkyl group may be substituted at any arbitrary position with an alkoxyl group having a carbon number of 1 to 8, an aryl group, a hydroxyl group, an amino group, or a halogen atom.)

Specifically, as phosphines, aryl phosphines such as triphenylphosphine, tri(o-, m-, or p-tolyl)phosphine, and tri(p-methoxyphenyl)phosphine; or alkyl phosphines such as tributyl phosphine, trioctylphosphine, tris (3-hydroxypropyl) phosphine, and tribenzil phosphine can be used suitably. Among others, triphenylphosphine, tri(p-tolyl)phosphine, and tri(p-methoxyphenyl)phosphine, trioctyl phosphine, and tris(3-hydroxypropyl)phosphine can be used especially suitably, and triphenylphosphine, tri(p-tolyl)phosphine, or tri(p-methoxyphenyl)phosphine can be used most preferably.

The complex of aryl phosphines or alkyl phosphines is cationic, and hence a counter anion is necessary. As the counter anion, organic sulfonic acid ion, organic carboxylic acid ion, halogen ion, nitric acid ion, or sulfuric acid ion is suitable. These can be used singularly or in combination of two or more kinds.

As the organic sulfonic acid used as the counter anion, for example, methanesulfonic acid, 2-hydroxyethanesulfonic acid, 2-hydroxypropane-1-sufonic acid, trichloromethane sulfonic acid, trifluoromethanesulfonic acid, benzenesulfonic acid, toluenesulfonic acid, phenolsulfonic acid, cresolsulfonic acid, anisolesulfonic acid, or naphthalenesulfonic acid can be used suitably. Among others, methanesulfonic acid, toluenesulfonic acid, or phenolsulfonic acid is especially preferred.

As the organic carboxylic acid used as the counter anion, for example, monocarboxylic acid such as formic acid, acetic acid, propionic acid, butanoic acid, octanoic acid; dicarboxylic acid such as oxalic acid, malonic acid, or succinic acid; hydroxycarboxylic acid such as lactic acid, glycollic acid, tartaric acid, or citric acid; or halogen-substituted carboxylic acid such as monochloroacetic acid, dichloroacetic acid, trichloroacetic acid, trifluoroacetic acid, or perfluoropropionic acid can be used suitably. Among others, formic acid, acetic acid, oxalic acid, lactic acid, trichloroacetic acid, trifluoroacetic acid, or perfluoropropionic acid is preferred, particularly acetic acid, lactic acid, or trifluoroacetic acid is most preferred.

As the above-mentioned azoles, it is possible to use, for example, one type or a mixture of two or more kinds of tetrazole, triazole, benzotriazole, imidazole, benzimidazole, pyrazole, indazole, thiazole, benzothiazole, oxazole, benzoxazole, pyrrole, indole, or derivatives of these.

Among others, tetrazole, 5-mercapto-1-phenyltetrazole, 1,2,3-triazole, 1,2,4-triazole, 3-mercapto-1,2,4-triazole, benzotriazole, tolyltriazole, carboxybenzotriazole, imidazole, 2-mercaptoimidazole, benzimidazole, 2-octylbenzimidazole, 2-phenylbenzimidazole, 2-mercaptobenzimidazole, 2-methylthiobenzimidazole, pyrazole, indazole, thiazole, benzothiazole, 2-phenylbenzothiazole, 2-mercaptobenzothiazole, 2-methylthiobenzothiazoleisooxazole, anthranil, benzoxazole, 2-phenylbenzoxazole, 2-mercaptobenzoxazole, pyrrole, 4,5,6,7-tetrahydroindole, or indole is preferred.

Especially preferred are 5-mercapto-1-phenyltetrazole, 3-mercapto-1,2,4-triazole, benzotriazole, tolyltriazole, carboxybenzotriazole, imidazole, benzimidazole, 2-octylbenzimidazole, 2-mercaptobenzimidazole, benzothiazole, 2-mercaptobenzothiazole, benzoxazole, and 2-mercaptobenzoxazole.

The ratio of the tin powder to the salt of the metal or the complex in the above-mentioned deposition type solder composition (the ratio of the mass of tin powder to the mass of the salt of metal or the complex) is approximately 99:1 to approximately 50:50; preferably approximately 97:3 to approximately 60:40.

Preferably, the solder paste composition of the present invention contains a flux in addition to the above-mentioned components. The flux comprises mainly a base resin, an active agent (activator) and a thixotropy agent. When the flux is used in its liquid state, an organic solvent may be added thereto.

As the base resin, for example, rosin or acryl resin can be used.

As the rosin, rosin conventionally used for the purpose of a flux, or its derivative can be used. As the rosin, for example, usual gum rosin, tall rosin, and wood rosin can be used. As rosin derivative, for example, heat-treated resin, polymer rosin, hydrogenated rosin, formylated rosin, rosin ester, rosin modified maleic resin, rosin modified phenol resin, and rosin modified alkyd resin can be used.

Preferably, the acryl resin has a molecular weight of 10,000 or below, more preferably 3,000 to 8,000. When the molecular weight exceeds 10,000, crack resistance and stripping resistance might be lowered. In order to aid active action, it is preferable to use one having an acid number of 30 or more. Since it is necessary to be softened during the time of soldering, the softening point is preferably 230° C. or below. Hence, it is preferable that the acryl resin is obtained as follows; a monomer having a polymerizable unsaturated group, such as acrylic (methacrylic) acid or its various esters, crotonic acid, itaconic acid, maleic acid (anhydride) or its ester, acrylonitrile (methacrylonitrile), acrylamide (methacrylamide), vinyl chloride, or vinyl acetate, be used and radical polymerized by block polymerization method, liquid polymerization method, suspension polymerization method, emulsion polymerization method and the like, by using catalyst such as peroxide.

The above-mentioned base resins can be used together. For example, the rosin and the acrylic resin may be used in mixtures with each other. The content of the base resin is 0.5 to 80 mass %, preferably 20 to 70 mass %, to the total amount of the flux.

Examples of the active agent are hydrohalogenic acid salt such as ethylamine, propylamine, diethylamine, triethylamine, ethylenediamine, and aniline; and organic carboxylic acid such as lactic acid, citric acid, stearic acid, adipic acid, diphenylacetic acid, and benzoic acid. The content of the active agent is preferably 0.1 to 30 mass % to the total amount of the flux.

Examples of the thixotropy agent are cured castor oil, bees wax, and carnauba wax. The content of the thixotropy agent is preferably 1 to 50 mass % to the total amount of the flux.

Examples of the organic solvent are alcohol base solvents such as ethyl alcohol, isopropyl alcohol, ethyl cellosolve, butyl carbitol, and hexyl carbitol; ester base solvents such as ethyl acetate and butyl acetate; and hydrocarbon base solvents such as toluene and turpentine oil. From the viewpoints of the volatility and the solubility of the active agent, it is preferable to use the alcohol base solvent as a main solvent. Preferably, the organic solvent is added in a range of 1 to 99 mass % to the total amount of the flux.

The flux used in the present invention can be used together with synthetic resin well-known as base resin for the flux, such as polyester resin, phenoxy resin, or terpen resin. Alternatively, additives such as oxidation inhibitor, fungicide, and flatting agent may be added to the flux. When the solder paste composition of the present invention is the deposition type solder composition, the above-mentioned the salt of metal or the complex may be incorporated in the flux.

The mass ratio of the above-mentioned solder powder to the flux in the solder paste composition of the present invention (the ratio of the solder powder to the flux) is preferably approximately 95:5 to approximately 80:20.

No special limitations are imposed on the method of filling the above-mentioned solder paste composition 5 onto the electrodes 2 within the opening parts surrounded by the dam 4. For example, imprinting may be used for the filling. No special limitations are imposed on the heating temperature when the solder is adhered to the surfaces of the electrodes 2 by heating it to a predetermined temperature after the filling. However, in consideration of the heat resistance of the electronic components, the heating temperature is about 180 to 280° C., preferably about 200 to 250° C. The heating time may be determined suitably according to the constitution of the composition, or the like, and it is usually about 30 seconds to 10 minutes, preferably about 1 minute to 5 minutes.

The height of the solder bumps 6 obtained is usually approximately 40 to 100 μm. In accordance with the present invention, the solder bumps 6 can be arranged with a fine pitch, for example, with a pitch of approximately 50 to 120 μm.

Examples of the present invention will be described below in detail. It is understood, however, that the examples are for the purpose of illustration and the invention is not to be regarded as limited to any of the specific materials or condition therein.

EXAMPLES

Examples 1 to 4 and Comparative Examples 1 to 4

<Manufacture of Dam>

There was used a substrate, a surface of which was coated with a solder resist film having a thickness of 15 μm, pads (electroless nickel metal plating electrodes) being exposed from opening parts (85 μm in diameter) formed in the solder resist film. Specifically, 841 pads were formed on the substrate with a pitch of 225 μm.

A dry film resist (Product name "SUNFORT™ AQ4036" manufactured by Asahi Kasei EMD Corporation) was press-adhered to the surface of the substrate. Then, a mask was disposed on the surface of a photosensitive resin layer, and the respective pads and their surroundings were exposed, and thereafter a support film was stripped, followed by development with an aqueous solution of $Na_2CO_3$. Thus, a (resist) dam, opening parts of which had an inner diameter of 150 μm and a thickness of 40 μm, was formed with a pitch of 225 μm around the pads.

<Manufacture of Solder Paste Compositions>

Each of Sn/Cu alloy powders (alloy powders Nos. 01 to 08) having a particle size distribution shown in the following Table 1, and a flux were kneaded at the following rate, thereby obtaining solder paste compositions as shown in Table 2 (solder pastes Nos. 01P to 08P).

| | |
|---|---|
| Sn/Cu alloy powder (Sn/Cu (mass ratio) = 99.3/0.7) | 88 mass % |
| Flux | 12 mass % |

The flux used above was manufactured by mixing the following recipe ingredients and heat-melting at 150° C., followed by cooling to room temperature.

| | |
|---|---|
| Rosin resin (formylated rosin, product name "FG-90" manufactured by Harima Chemicals, Inc.) | 50 mass % |
| Benzoic acid (organic acid) | 8 mass % |
| Hexyl carbitol (solvent) | 7 mass % |
| Cured castor oil (thixotropy agent) | 35 mass % |

TABLE 1

| Alloy powder[1] No. | Particle size distribution (%)[2] | | | |
|---|---|---|---|---|
| | below 10 μm | 10 μm or more below 20 μm | 20 μm or more | below 10 μm + 10 μm or more below 20 μm |
| 01 | 20 | 79 | 1 | 99 |
| 02 | 90 | 9 | 1 | 99 |
| 03 | 52 | 38 | 10 | 90 |
| 04 | 16 | 74 | 10 | 90 |
| 05 | 8 | 78 | 14 | 86 |
| 06 | 1 | 90 | 9 | 91 |
| 07 | 38 | 50 | 12 | 88 |
| 08 | 32 | 56 | 12 | 88 |

[1] Sn/Cu (mass ratio) = 99.3/0.7
[2] Particle size distribution was measured by using a microtrack particle size distribution analyzer (product name "MT3000" manufactured by Nikkiso Co., Ltd.).

<Solder Precoating Process>

Each of the solder paste compositions obtained above (the solder pastes Nos. 01P to 08P) was filled by imprinting into individual opening parts of the above-mentioned substrate provided with the dam. Subsequently, under an atmosphere of nitrogen, the solder was melted by heating to 230° C. or above for one minute, and solder precoating was carried out to form solder bumps.

<Dam Removing Process>

A 17 ml of 2-ethanolamine (manufactured by MITSUBISHI GAS CHEMICAL COMPANY, INC.) was mixed with 83 ml of distilled water at room temperature, thereby obtaining 100 ml of a stripping agent. The 100 ml of the stripping agent was then poured in to a 200 ml-beaker, and heated to about 50° C. on a hot plate. Thereafter, the dam was removed by immersing the above-mentioned substrate subjected to the solder precoating process in the stripping agent for two minutes.

<Cleaning of Solder Paste Residue>

A 300 ml of butyl carbitol solution was poured into a 500 ml-beaker, and the above-mentioned substrate with the dam removed was immersed in this solution of 80° C. for two minutes, while applying ultrasonic thereto. Subsequently, this substrate was immersed in 300 ml of isopropyl alcohol for two minutes, in order to remove excess solder paste composition. Thereafter, by hot air, each of the substrates was dried to manufacture a solder precoated substrate with a pitch of 225 μm. Five solder precoated substrates were manufactured per solder paste (The precoating process was carried out under the same heating condition.).

The respective solder precoated substrates thus obtained were evaluated in terms of solder bump defects. The evaluation method is as follows, and the results are presented in Table 2.

<Evaluation Method of Solder Bump Defects>

In respect to the individual solder precoated substrates after the solder paste residue cleaning, the presence or absence of solder bump defect locations in the five substrates was checked on a microscope ("VHX-200" manufactured by KEYENCE CORPORATION), to determine the number of occurrence of the defects.

TABLE 2

| | Solder paste No. | Alloy powder No. | Number of solder bump defects[1] | | | | |
|---|---|---|---|---|---|---|---|
| | | | Substrate 1 | Substrate 2 | substrate 3 | substrate 4 | substrate 5 |
| Example 1 | 01P | 01 | 0 | 0 | 0 | 0 | 0 |
| Example 2 | 02P | 02 | 0 | 0 | 0 | 0 | 0 |
| Example 3 | 03P | 03 | 0 | 0 | 0 | 0 | 0 |
| Example 4 | 04P | 04 | 0 | 0 | 0 | 0 | 0 |
| Comparative Example 1 | 05P | 05 | 2 | 1 | 1 | 0 | 2 |
| Comparative Example 2 | 06P | 06 | 35 | 20 | 28 | 31 | 22 |
| Comparative Example 3 | 07P | 07 | 18 | 0 | 2 | 0 | 4 |
| Comparative Example 4 | 08P | 08 | 5 | 12 | 0 | 2 | 0 |

[1]The number of pads to be measured is 841 per substrate (All of the pads were measured.).

It will be noted from Table 2 that the solder bumps formed by using the solder paste compositions of Examples 1 to 4 (the solder pastes Nos. 01P to 04P) suppressed the occurrence of bump defects and improved the yield. In contrast, the solder bumps formed by using the solder paste compositions of Comparative Examples 1 to 4 (the solder pastes Nos. 05P to 08P) had bump defects.

Examples 5 to 7 and Comparative Example 5

<Manufacture of Dam>

There was used a substrate, a surface of which was coated with a solder resist film having a thickness of 10 μm, pads (electroless nickel metal plating electrodes) being exposed from opening parts (70 μm in diameter) formed in the solder resist film. Specifically, 6,561 pads were formed on the substrate with a pitch of 150 μm.

Subsequently, in the same manner as in Examples 1 to 4, a (resist) dam, opening parts of which had an inner diameter of 150 μm and a thickness of 40 μm, was formed with a pitch of 150 μm around the pads.

<Manufacture of Solder Precoated Substrates>

There were used the solder paste compositions (solder pastes Nos. 01P, 03P, 04P, and 06P), which were obtained in Examples 1, 3, and 4, and Comparative Example 2, respectively.

In the same manner as in Examples 1 to 4, the solder precoating process, the dam removing process, and the solder paste residue cleaning were carried out to obtain each solder precoated substrate with a pitch of 150 μm. Two solder precoated substrates were manufactured per solder paste (The precoating process was carried out under the same heating condition.).

In respect to the individual solder precoated substrates, the evaluation of solder bump defects was conducted in the same manner as in Examples 1 to 4. The results are presented in Table 3.

TABLE 3

| | Solder paste No. | Alloy powder No. | Number of solder bump defects[1] | |
|---|---|---|---|---|
| | | | Substrate 1 | Substrate 2 |
| Example 5 | 01P | 01 | 0 | 0 |
| Example 6 | 03P | 03 | 0 | 0 |
| Example 7 | 04P | 04 | 3 | 0 |
| Comparative Example 5 | 06P | 06 | 8 | 6 |

[1]The number of pads to be measured is 6,561 per substrate (All of the pads were measured.).

It will be noted from Table 3 that the solder bumps formed by using the solder paste compositions of Examples 5 to 7 (the solder pastes Nos. 01P, 03P, and 04P) had less bump defects and suppressed the occurrence of the bump defects. In contrast, the solder bump formed by using the solder paste composition of Comparative Example 5 (the solder paste No. 06P) had a large number of bump defects.

Next, in respect to the above individual solder precoated substrates with a pitch of 150 μm, the heights of the solder bumps were measured to evaluate the average height and variations in height (standard deviation). The evaluation method is as follows, and the results are presented in Table 4.

<Methods of Evaluating Average Height of Solder Bumps and Variations in Height>

Using a depth of focus meter (product name "STM" manufactured by OLYMPUS CORPORATION), the distance from the solder resist surface to the bump top was measured as a solder height. The solder heights of arbitrary 60 bumps per substrate were determined, and the average value (the average height of the solder bumps) and variations in height (standard deviation) were calculated from the results of the measurements.

TABLE 4

| | Solder paste No. | Alloy powder No. | Average Height of Solder Bumps (AVG) (μm) | Standard deviation (STD) |
|---|---|---|---|---|
| Example 5 | 01P | 01 | 45.5 | 2.5 |
| Example 6 | 03P | 03 | 47.4 | 2.2 |
| Example 7 | 04P | 04 | 46.0 | 3.1 |
| Comparative Example 5 | 06P | 06 | 45.1 | 5.2 |

It will be noted from Table 4 that the solder bumps formed by using the solder paste compositions of Examples 5 to 7 (the solder pastes Nos. 01P, 03P, and 04P) produced the solder bumps of a uniform height. In contrast, the solder bump formed by using the solder paste compositions of Comparative Example 5 (the solder paste No. 06P) had variations in height.

Examples 8 to 10 and Comparative Example 6

<Manufacture of Dam>

There was used the same substrates as in Examples 5 to 7. Subsequently, in the same manner as in Examples 5 to 7, a (resist) dam, opening parts of which had an inner diameter of 150 μm and a thickness of 40 μm, was formed on the surface of each of the substrates with a pitch of 150 μm around the pads.

<Manufacture of Solder Paste Compositions>

Each of solder paste compositions as shown in Table 5 (solder pastes Nos. 09P to 12P, each being deposition type solder composition) were obtained in the same manner as in Examples 1 to 4, except that Sn/Cu alloy powders (alloy powders Nos. 01, 03, 04, and 06) having a particle size distribution shown in Table 1, and the following flux were used.

The used flux was obtained by mixing the following recipe ingredients and heat-melting at 150° C., followed by cooling to room temperature.

| | |
|---|---|
| Rosin resin | 40 mass % |
| (formylated rosin, product name "FG-90" manufactured by Harima Chemicals, Inc.) | |
| Benzoic acid (organic acid) | 8 mass % |
| Hexyl carbitol (solvent) | 7 mass % |
| Cured castor oil (thixotropy agent) | 35 mass % |
| Copper stearate | 10 mass % |

<Manufacture of Solder Precoated Substrates>

In the same manner as in Examples 1 to 4, the solder precoating process, the dam removing process, and the solder paste residue cleaning were carried out to obtain each solder precoated substrate with a pitch of 150 μm. Two solder precoated substrates were manufactured per solder paste (The precoating process was carried out under the same heating condition.).

In respect to the individual solder precoated substrates, the evaluation of solder bump defects was conducted in the same manner as in Examples 1 to 4. The results are presented in Table 5.

TABLE 5

| | Solder paste No. | Alloy powder No. | Number of solder bump defects[1] | |
|---|---|---|---|---|
| | | | Substrate 1 | Substrate 2 |
| Example 8 | 09P | 01 | 0 | 0 |
| Example 9 | 10P | 03 | 0 | 0 |
| Example 10 | 11P | 04 | 1 | 1 |
| Comparative Example 6 | 12P | 06 | 9 | 4 |

[1]The number of pads to be measured is 6,561 per substrate (All of the pads were measured.).

It will be noted from Table 5 that the solder bumps formed by using the solder paste compositions of Examples 8 to 10 (the solder pastes Nos. 09P to 11P) had less bump defects and suppressed the occurrence of the bump defects. In contrast, the solder bump formed by using the solder paste composition of Comparative Example 6 (the solder paste No. 12P) had a large number of bump detects.

While one preferred embodiment of the present invention has been described, the present invention is not limited to the foregoing embodiment.

What is claimed is:

1. A solder precoating method of forming solder bumps by forming a dam around electrodes on a substrate, filling a solder paste composition over the electrodes within opening parts surrounded by the dam, and heating the solder paste composition filled, so that solder is adhered to surfaces of the electrodes, wherein the method uses a solder paste composition containing solder powder, which is of a particle size distribution in which particles having a particle size of below 10 μm are present 16% or more, particles having a particle size of 10 μm or more and below 20 μm are present, and a sum of the particles having a particle size of below 10 μm and particles having a particle size of 10 μm or more and below 20 μm is 90% or more.

2. The solder precoating method according to claim 1, wherein the solder powder is of a particle size distribution in which particles having a particle size of below 10 μm are present 20% or more.

3. The solder precoating method according to claim 1, wherein the solder powder is of a particle size distribution in which a sum of particles having a particle size of below 10 μm and particles having a particle size of 10 μm or more and below 20 μm is 95% or more.

4. The solder precoating method according to claim 1, wherein the solder paste composition is of deposition type.

5. The solder precoating method according to claim 4, wherein the solder paste composition contains tin powder and salt of metal selected from lead, copper, and silver.

6. The solder precoating method according to claim 4, wherein the solder paste composition contains tin powder, and a complex of at least one selected from silver ion and copper ion and at least one selected from aryl phosphines, alkyl phosphines, and azoles.

7. The solder precoating method according to claim 5, wherein a ratio of a mass of the tin powder to a mass of the salt of metal is 99:1 to 50:50.

8. The solder precoating method according to claim 6, wherein a ratio of a mass of the tin powder to a mass of the complex is 99:1 to 50:50.

9. The solder precoating method according to claim 1, wherein the solder powder is of a particle size distribution in which particles having a particle size of 10 μm or more and below 20 μm are present in an amount of 9% or more.

* * * * *